(12) United States Patent
Chen et al.

(10) Patent No.: US 11,304,338 B1
(45) Date of Patent: Apr. 12, 2022

(54) SYSTEM, METHOD, AND APPARATUS FOR A HIGH-EFFICIENCY HEAT RISER

(71) Applicants: Nan Chen, Templestowe (AU); He Zhao, Flagstaff Hill (AU); Yunshui Chen, San Ramon, CA (US)

(72) Inventors: Nan Chen, Templestowe (AU); He Zhao, Flagstaff Hill (AU); Yunshui Chen, San Ramon, CA (US)

(*) Notice: Subject to any disclaimer, the term of this patent is extended or adjusted under 35 U.S.C. 154(b) by 0 days.

(21) Appl. No.: 17/108,808

(22) Filed: Dec. 1, 2020

(51) Int. Cl.
*H05K 7/20* (2006.01)

(52) U.S. Cl.
CPC ..... *H05K 7/20509* (2013.01); *H05K 7/20336* (2013.01)

(58) Field of Classification Search
None
See application file for complete search history.

(56) References Cited

U.S. PATENT DOCUMENTS

| | | | |
|---|---|---|---|
| 9,049,803 B2* | 6/2015 | Nordin | H05K 7/20818 |
| 10,548,240 B1 | 1/2020 | Iyengar et al. | |
| 2005/0047092 A1* | 3/2005 | Whit | H01L 23/4338 361/704 |
| 2013/0077232 A1 | 3/2013 | Nordin et al. | |
| 2013/0208422 A1 | 8/2013 | Hughes et al. | |
| 2017/0027083 A1* | 1/2017 | Bai | H05K 7/20672 |

* cited by examiner

*Primary Examiner* — Mukundbhai G Patel
(74) *Attorney, Agent, or Firm* — Ariel S. Bentolila; Bay Area IP Group, LLC

(57) ABSTRACT

A system, method, and apparatus for a heat riser having stackable blocks of thermally conductive material that include an upper block and a lower block, wherein the lower block has a lower surface that is configured to be engaged in thermal communication with a heat source. The lower block also having an inclined upper surface, that is configured to be in thermal communication with a block directly above, having a complemental inclined surface, wherein the blocks are elastically coupled with elastic components. The upper block may slide along the lower block allowing for vertical and horizontal axial elastic adjustment while providing consistent pressure to both the heat source and a cooling source to provide for heat dispersion along a thermal pathway from the heating source through the lower block, upper block and to a cooling source.

19 Claims, 11 Drawing Sheets

SYSTEM, METHOD, AND APPARATUS FOR A HIGH-EFFICIENCY HEAT RISER

CROSS-REFERENCE TO RELATED APPLICATIONS

Not applicable.

RELATED CO-PENDING U.S. PATENT APPLICATIONS

Not applicable.

INCORPORATION BY REFERENCE OF SEQUENCE LISTING PROVIDED AS ATEXT FILE

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to an apparatus for electronics cooling. More particularly, certain embodiments of the invention relate to a heat riser assembly for the cooling of electronics.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

In order for computer components to attain faster speeds, typically higher power consumption may be required. Computer components that consume high amounts of power generate a large amount of heat that, when improperly handled, may cause damage to the computer component and any surrounding components. Especially in large scale operations, such as, but not limited to, server farms, datacenters, computing clusters, etc., efficient and effective cooling of computer components may drastically effect processing power, speed, as well longevity of the overall system.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that existing cooling solutions for various computer components typically comprise air or water cooling devices. Conventional air cooling solutions transfer heat through a base plate mounted onto the computer component into a heat sink and use specialized fans to dissipate the heat. While air cooling may be an affordable option, the size of the heat sink required for adequate heat dissipation may be an issue for many computing systems, and air cooling may be less efficient than other cooling solutions. Liquid cooling may also be used to dissipate heat from computer components, and may be more efficient than air cooling. Because liquid is used, a large heat sink may not be required and the overall system may be substantially quieter without the loud fans associated with an air cooling solution. However, liquid cooling may include a risk of leaking and causing damage to the internal components of a computer system.

Additionally, with any cooling solution, integration with existing or legacy devices may be an important factor to consider. With large scale operations especially, upgrading a cooling system may require refactoring of an entire system to accommodate for more advanced cooling solutions. While one cooling solution may work with one system, it may not be easily compatible with another system. Space efficiency in, for example, without limitation, server farms, may be important for the overall cost effectiveness and reliability of the system as a whole, so a compact, easily adaptable, and efficient cooling system may be desirable.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A-2C illustrate an exemplary heat riser apparatus, wherein FIG. 1A shows a perspective view of a heat riser apparatus.

FIGS. 2A-2C illustrate exemplary vapor chambers of a heat riser apparatus, wherein FIG. 2A shows a cross-sectional view of a heat riser apparatus in a default position, FIG. 2B shows a cross-sectional view of a heat riser apparatus in a sliding up position, and FIG. 2C shows a vapor chamber, in accordance with an embodiment of the present invention;

FIGS. 3A-3B illustrate an exemplary heat riser apparatus mounted within a server, wherein FIG. 3A shows a perspective view of a heat riser apparatus mounted within a server, and FIG. 3B shows a cross section of a heat riser apparatus mounted within a server, in accordance with an embodiment of the present invention;

FIGS. 6A-6C illustrate an exemplary modified server cover, wherein FIG. 6A shows a conventional 2U server, FIG. 6B shows a server with a mounted modified server cover, and FIG. 6C shows a bottom view of a modified server cover, in accordance with an embodiment of the present invention;

FIGS. 7A-7B illustrate exemplary server measurements, wherein FIG. 7A shows the height of an exemplary server, and FIG. 7B shows a side view of an exemplary server, in accordance with an embodiment of the present invention;

FIGS. 8A-8C illustrates a stress diagram of an exemplary heat riser apparatus, wherein FIG. 8A shows a heat riser apparatus with total deformation, FIG. 8B shows a heat riser apparatus with strain distribution on all components, and FIG. 8C shows a heat riser apparatus with an even distribution of stress on elastic components, in accordance with an embodiment of the present invention;

FIGS. 9A-9C illustrates thermal simulation of an exemplary heat riser apparatus, wherein FIG. 9A shows a physical model of a heat riser apparatus, FIG. 9B shows a temperature field of a heat riser apparatus, and FIG. 9C shows a bottom view of a temperature field of a heat riser apparatus, in accordance with an embodiment of the present invention;

FIGS. 10A-10C illustrate an exemplary simplified heat riser, wherein FIG. 10A shows a prospective view of a simplified heat riser, FIG. 10B shows a cross section of a simplified heat riser, and FIG. 10C shows a cross section of a simplified heat riser at sliding-up conditions, in accordance with an embodiment of the present invention; and FIGS. 11A-11C illustrate an exemplary triple block heat riser, wherein FIG. 11A shows a prospective view of a triple block heat riser, FIG. 11B shows an exploded view of a triple block heat riser, and FIG. 11C shows a cross-sectional view of a triple block heat riser, in accordance with an embodiment of the present invention.

Figure 1A:
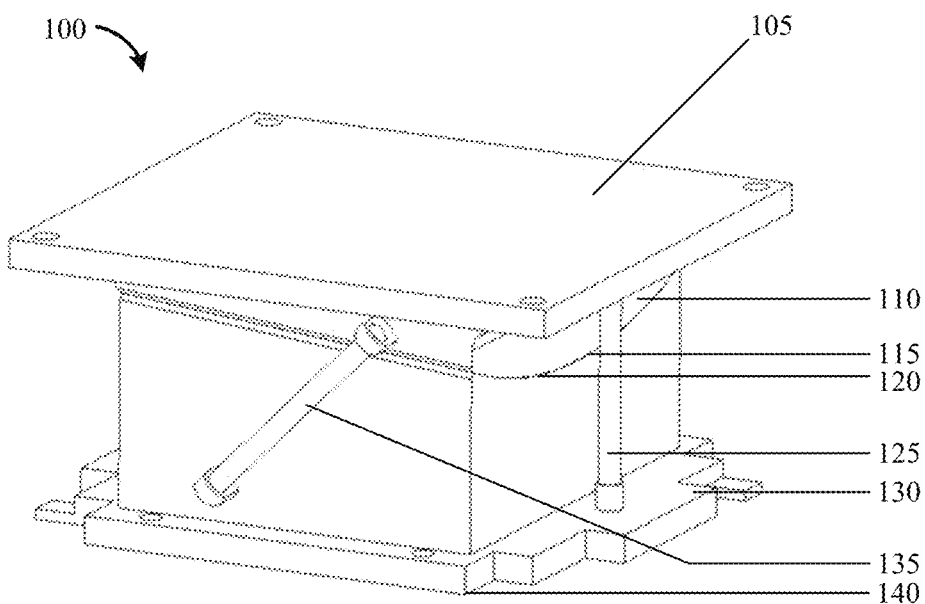

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of Claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the foregoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not to include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology

The following paragraphs provide definitions and/or context for terms found in this disclosure (including the appended claims):

"Comprising" And "contain" and variations of them— Such terms are open-ended and mean "including but not limited to". When employed in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. .sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s).

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other. "Thermally Coupled" means that elements are able to transfer heat, possibly indirectly, from one to the other. "Thermal Communication" refers to the transfer of heat, possibly indirectly, from one element to another.

It is to be understood that any exact measurements/dimensions or particular construction materials indicated herein are solely provided as examples of suitable configurations and are not intended to be limiting in any way.

Depending on the needs of the particular application, those skilled in the art will readily recognize, in light of the following teachings, a multiplicity of suitable alternative implementation details.

Figure 1B:
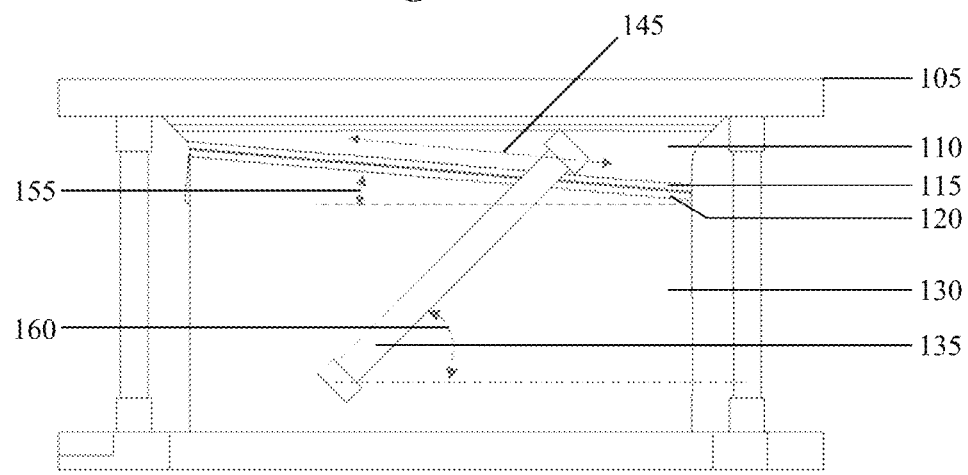
FIG. 1B shows a first side view of a heat riser apparatus.
Figure 1C:
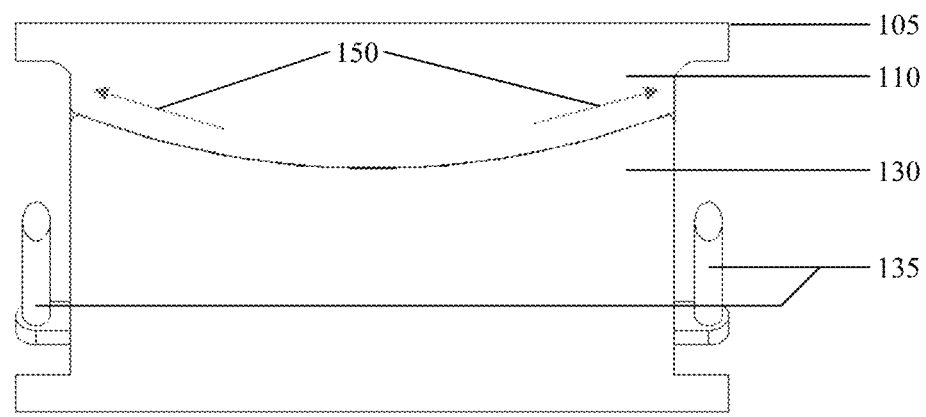
FIG. 1C shows a second cross-section of a heat riser apparatus, in accordance with an embodiment of the present invention.

FIGS. 1A-1C illustrate an exemplary heat riser apparatus constructed of thermally conductive material, wherein FIG. 1A shows a perspective view of a heat riser apparatus, FIG. 1B shows a first side view of a heat riser apparatus, and FIG. 1C shows a second cross-section of a heat riser apparatus, in accordance with an embodiment of the present invention. With reference to FIGS. 1A-1C, heat riser apparatus 100 may comprise upper block 110 and lower block 130 wherein said blocks appear in a stacked configuration. Lower block 130 may include two major surfaces: lower surface 140 of heat riser 100, and upper cylindrical surface 120. Upper block 110 may also include two major surfaces: upper surface 105 of heat riser apparatus 100 and lower cylindrical surface 115. Lower block 130 may make contact with lower cylindrical surface 115 of upper block 110 via upper cylindrical surface 120. Depending on the force applied to upper block 110, lower cylindrical surface 115 may slide along upper cylindrical surface 120 and make heat riser apparatus 100 adaptable to a variety of different server and electronic component configurations, and thereby allowing for vertical and horizontal axial elastic adjustment while providing consistent pressure to both a said heat source and a cooling source to provide for adequate heat dispersion along a thermal pathway. Upper block 110 may slide along lower block 130 in axial direction 145, as shown in FIG. 1B, as well as radial direction 150, similar to a concave cylindrical depressions and convex cylindrical protrusion, as shown in FIG. 1C. When sliding along axial direction 145, upper surface 105 may be lifted or lowered, and may be able to accommodate for taller or shorter server configurations, respectively. Additionally, while rotating in radial direction 150, upper surface 105 may be tilted. The combination of movement in axial direction 145 and radial direction 150 may allow for heat riser apparatus 100 to compensate for differences in positional requirements for various server configurations. Lower block 130 may be mounted to, for example, without limitation, a motherboard, and make direct contact with a heat source to be cooled. Heat may be transferred from the heat source into heat riser apparatus 100 through lower surface 140 of lower block 130.

In order to maintain a position of upper block 110, a predetermined amount of force may be applied to upper block 110, said force determining the amount of pressure that may be applied to the heat source by heat riser apparatus 100. In a preferred embodiment, the force applied to upper block 110 may be determined such that the force is great enough to ensure a secure abutment of upper block 110 against lower block 130, said abutment unimpaired by, for example, without limitation, gravity or accelerating forces due to vibration. These blocks may be elastically coupled. Simultaneously, the force may be limited so pressure from lower block 130 is not great enough to damage the heat source or any supporting electrical components. As will be appreciated by one skilled in the art, selection of elastic components may be based on a variety of different factors depending on, for example, without limitation, the type of the heat source, the type of the PCB, the tolerance of the cold plate or other contacts contacting upper surface 105, etc. Because there may be substantial variability between different systems, the selection of elastic components 135 may vary from system to system, and may be determined by, for example, without limitation, the schematic diagrams to be described with reference to FIG. 4 below. The force applied to upper block 110 may be applied through first elastic components 125 and second elastic components 135. Second elastic components 135 may be mounted at angles 155 and 160 depending on the specific structural needs of the server or component configuration. Angles 155 and 160 may depend on, for example, without limitation, the amount of movement in axial direction 145, the amount of movement in radial direction 150, pressure placed on the heat source, strain on second elastic components 135, etc. A static force decomposition of first elastic components 125 and second elastic components 135 may indicate an ideal selection of magnitude and direction of force caused by the elastic components, which may in turn create an optimal and stable press force on contacting surfaces for minimal thermal contact resistance without sacrificing reliability.

The elastic components 135 in combination with the stacked blocks 110/130 create a sliding mechanism to achieve an automatic tolerance compensation approach. The sliding mechanism comprises the incline of the lower block 130 and the complemental incline of the block directly above the lower block, which in some cases may be an upper block 110 or a middle block 1104 (seen in FIGS. 11A-11C), elastically engaging, wherein the lower block 130 may be statically mounted and the block directly above the lower block may be dynamically slidable from use of elastic components 135 that are mounted at an angles 155 and 160. This angulation assists with the pressure requirements in order to provide an automatic tolerance compensation. The elastic limits are configured to be in a range of tensions that provide for secured couplement, but do not produce excess pressure that may damage any of the components herein.

Optionally, one or more of lower block 130 and upper block 110 may include vapor chambers to enhance the heat dissipation capability of heat riser apparatus 100 up to, for example, without limitation, 500 W per CPU under the limits of internal server volume. Vapor chambers will be discussed in greater detail below with respect to FIGS. 2A-2C. Additionally, thermal grease may be used on various surfaces of heat riser 100 and surrounding server components, including, for example, without limitation, on upper surface 105, lower cylindrical surface 115, upper cylindrical surface 120, lower surface 140, etc. to minimize thermal resistance.

Figure 2A:
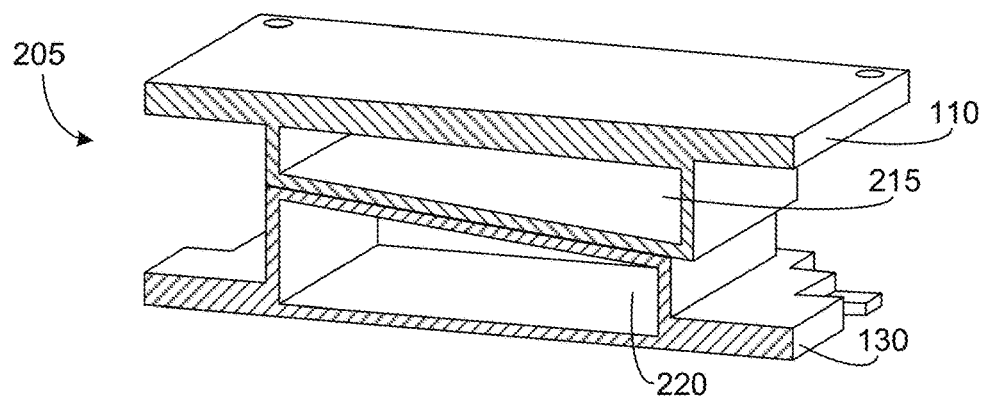
Figure 2B:
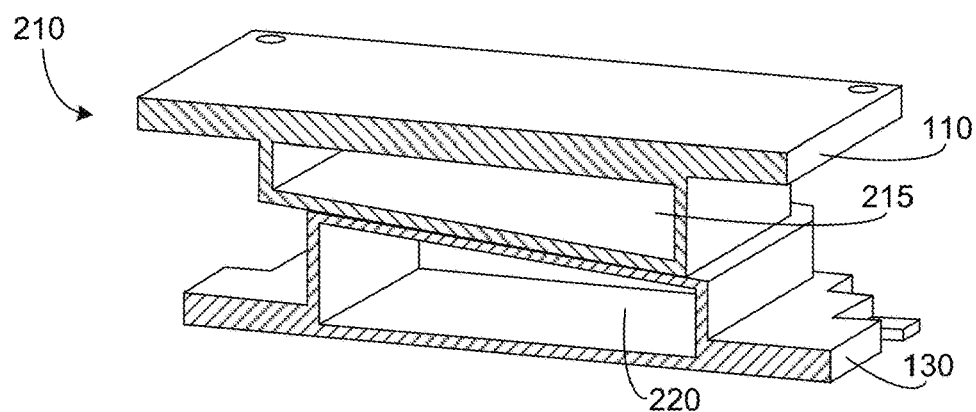
Figure 2C:
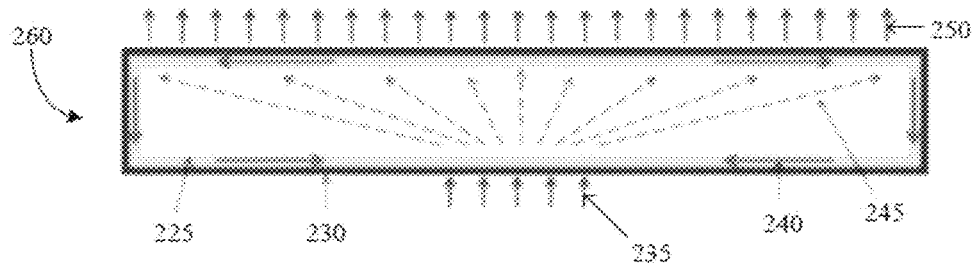

FIGS. 2A-2C illustrate exemplary vapor chambers of a heat riser apparatus, wherein FIG. 2A shows a cross-sectional view of a heat riser apparatus in a default position, FIG. 2B shows a cross-sectional view of a heat riser apparatus in a sliding up position, and FIG. 2C shows a vapor chamber, in accordance with an embodiment of the present invention. With reference to FIGS. 1A-1C and FIGS. 2A-2C, Vapor chambers may be integrated with heat riser apparatus 100 for increased heat dissipation performance. Upper block 110 may contain upper vapor chamber 215, while lower block 130 may contain lower vapor chamber 220. Additionally, upper vapor chamber 215 and lower vapor chamber 220 may remain aligned while heat riser apparatus 100 is in default configuration 205, or offset while heat riser apparatus 100 is in sliding up configuration 210. Vapor chambers may be utilized in the aforementioned design of heat riser 210 in multiple ways. For example, without limitation, a vapor chamber may be inserted into one or more of lower block 130 and upper block 110. The vapor chamber 260 may be pre-sealed prior to being inserted into a hollowed out cavity or void. Initially, lower block 130 and upper block 110 may be machined with one or more vapor chambers. The vapor chambers may then be pushed into the reserved cavities of upper block 110 and/or lower block 130.

Tight fitting between upper block 110, lower block 130, and the vapor chambers may be adopted for low contacting thermal resistance. In an alternative embodiment, vapor chambers may be manufactured directly in the cavities of upper block 110 and/or lower block 130. In this case, the walls of said vapor chamber 260 make up the walls of each block. However, this method may require a large capital investment, and may not be preferable when compared to inserting the vapor chambers.

The internal mechanics of upper vapor chamber 215 and lower vapor chamber 220 are described with reference to FIG. 2C. Vapor chamber 260 may be used to transfer heat from heat source/condenser 235 to heat sink/condenser 250. For lower vapor chamber 220, heat source 235 may be the computer component to be cooled and heat sink 250 may be upper vapor chamber 215. Similarly, for upper vapor chamber 220, heat source 235 may be lower vapor chamber 220 while heat sink 250 may be a cold plate. The vapor chamber includes an outer container 230 and wick 225. Heat may be transferred from heat source 235 and spread to heat sink 250 using forced convection of liquid 240. Liquid 240 may be contained in wick 225 along the interior surface of vapor chamber 260. As liquid 240 may be heated by heat source 235, liquid 240 may become vapor 245 and spread to the upper surface of vapor chamber 250. Vapor 245 may then condense on the surfaces of heat sink 250, and capillary forces in wick 225 may return the condensed vapor back to heat source 235. The mechanics of a vapor chamber may also provide improved thermal connection between upper block 110 and lower block 130 by way of a thermal pathway. When the upper block 110 is slid relative to lower block 130, the surface area of the contact point is reduced. The mechanics of vapor chambers direct where the warmer vapors will go by influencing the vapors to seek out a colder source to disburse the heat. As such, the warm vapors will naturally target and accumulate at the connection point between the two blocks and avoid excess heat accumulation in areas are not directly in communication with the upper block 110.

Because heat transfer occurs on the cold and hot surfaces of vapor chamber 260 in the form of latent heat, a higher overall heat conductive coefficient may be achieved when compared to, for example, without limitation, copper, which may eventually reduce the overall heat resistance of heat riser 210. The effective thermal conductivity of vapor chamber 260 may typically be 435.6-557.9 W/m·K, which may be an improvement over copper with a typical effective thermal conductivity of 385 W/m·K.

Figure 3A:
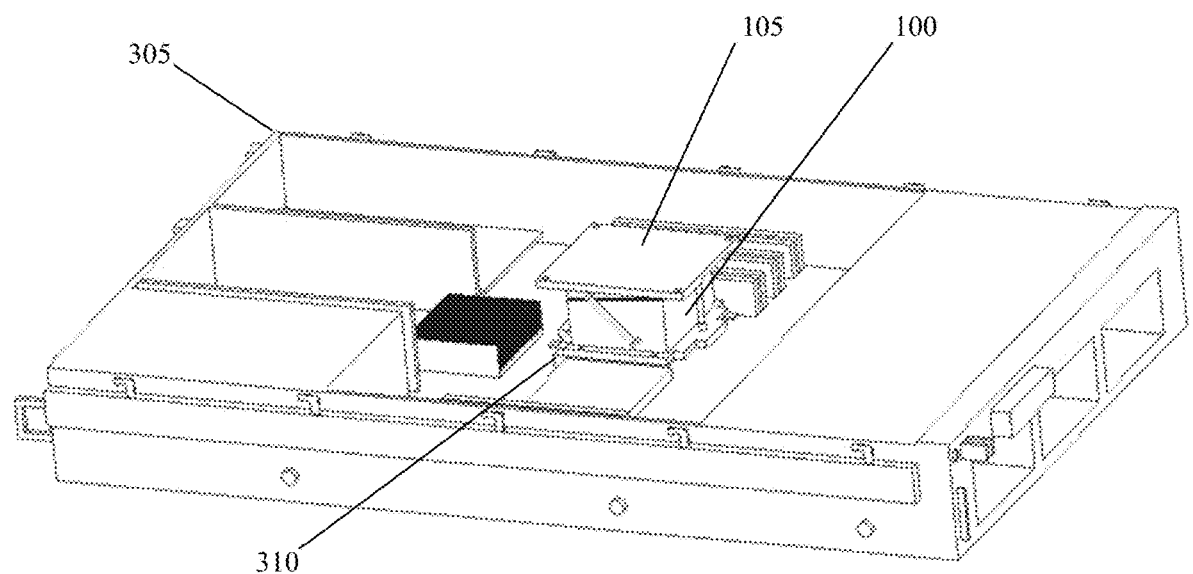
Figure 3B:
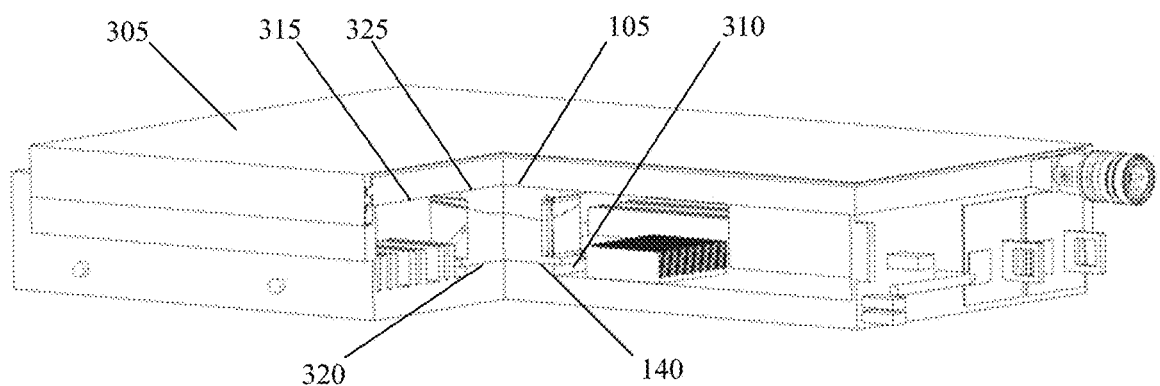

FIGS. 3A-3B illustrate an exemplary heat riser apparatus mounted within a server, wherein FIG. 3A shows a perspective view of a heat riser apparatus mounted within a server, and FIG. 3B shows a cross section of a heat riser apparatus mounted within a server, in accordance with an embodiment of the present invention. With reference to both FIGS. 1A-1C and FIGS. 3A-3B, heat riser apparatus 100 may be mounted to, for example, without limitation, heat source 310 of server 305. Heat source 310 may be any type of computer component known in the art, such as, without limitation, a central processing unit (CPU), graphics processing unit (GPU), and any other type of chip or electronic device, including power supplies, with the top plane to be attached. Additionally, integration of heat riser apparatus 100 within server 305 may also lower the ambient temperature within server 305, cooling other nearby components. Lower surface 140 of heat riser apparatus 100 may be placed on top of upper surface 320 of heat source 310 in order to transfer heat from heat source 310 into heat riser apparatus 100. Additionally, upper surface 105 of heat riser apparatus 100 may be adjacent to lower surface 315 of cold plate 325. Thus, heat transferred into heat riser apparatus 100 may be transferred into cold plate 325 for dissipation. Cold plate 325 may be integrated into the lid of server 305, as will be described below with reference to FIGS. 6A-6C.

Figure 4:
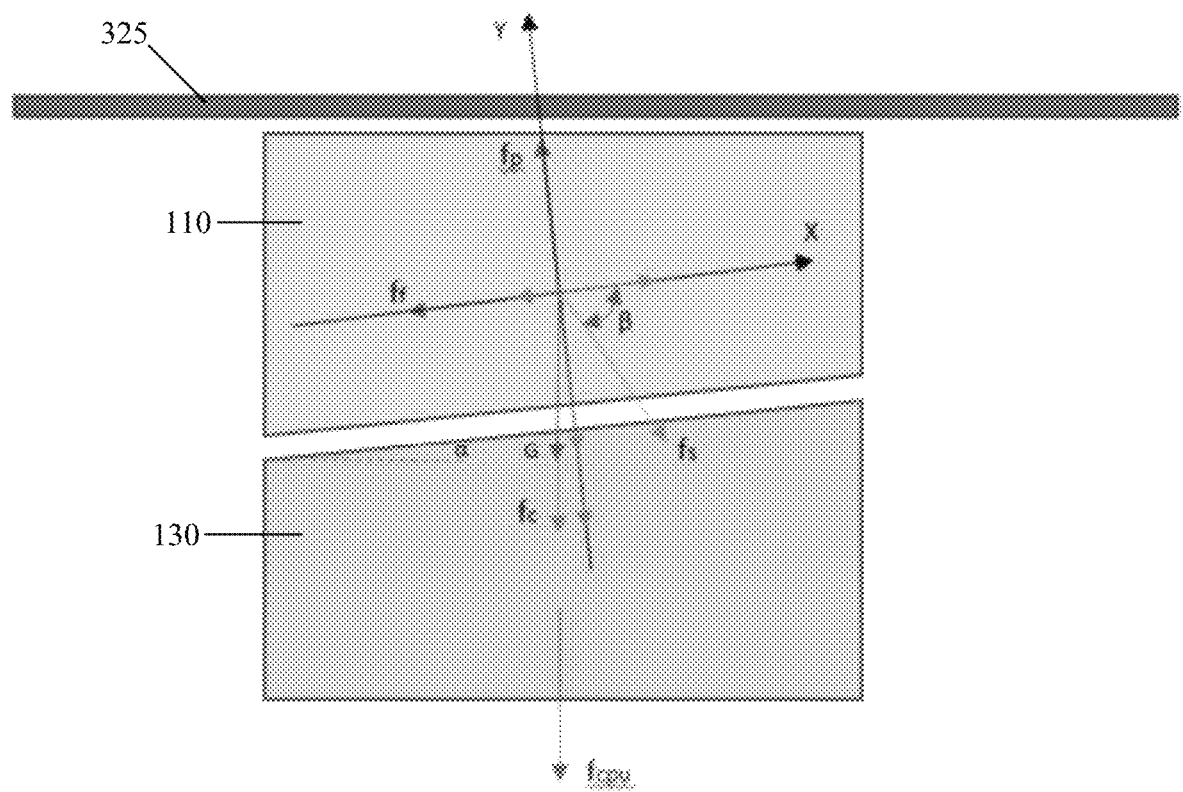
FIG. 4 illustrates as schematic diagram of an exemplary heat riser apparatus, in accordance with an embodiment of the present invention.

FIG. 4 illustrates a schematic diagram of an exemplary heat riser apparatus, in accordance with an embodiment of the present invention. With reference to FIGS. 1A-1C, FIGS. 3A-3B, and FIG. 4, a schematic diagram may be used to evaluate various aspects of heat riser apparatus 100, especially, for example, without limitation, the force placed upon the CPU or other computer component. As shown, cold plate 325 may sit on top of upper block 110, which may sit on top of lower block 130, and lower block 130 may be mounted on top of, for example, without limitation, a CPU (not shown). The schematic diagram may be described with reference to the following symbols, wherein: $f_p$ may be the supporting force from lower block 130, $P_p$ may be the pressure on the contacting surface between lower block 130 and upper block 110, $f_f$ may be frictional force, $f_c$ may be the pressure from cold plate 325, $f_s$ may be the force from the spring (i.e. the elastic components), $\mu$ may be the friction coefficient, $f_{cpu}$ may be the force on the CPU, $\alpha$ may be the angle of the inclined upper surface of lower block 130, $\beta$ may be the angle between an elastic component and the inclined upper surface of lower block 130, k may be the stiffness of the elastic component, $\Delta L$ may be the deformation of the spring, $\Delta$Hor may be the horizontal displacement of upper block 110, and $\Delta$Ver may be the vertical displacement of upper block 110.

A possible description of the amount of force applied from upper block 110 applied to cold plate 325 may be described by $f_p=(f_c+G)*\cos(\alpha)+f_s*\sin(\beta)$. The force balance along an X direction may be described by $f_s*\cos(\beta)=(f_c+G)*\sin(\alpha)+f_f$. The schematic diagram along the y direction may be described by $f_s*\cos(\beta)=(f_c+G)*\sin(\alpha)-\mu*((f_c+G)*\cos(\alpha)+f_s*\sin(\beta))$. The force applied on the CPU may be described by $f_{cpu}=(f_c+G)+f_s*\cos(90°-\beta+\alpha)$. The ratio of force magnitude applied by the elastic components and by cold plate 325 may be $f_s/(f_c+G)=(\sin(\alpha)-\mu*\cos(\alpha))/(\cos(\beta)+\mu*\sin(\beta))$. The extension of the elastic component may be described by $\Delta x=-f_s/k$. The friction force between upper block 110 and lower block 130 may be described by $f_f=\mu*(-f_p)$. While the aforementioned formulas may be used to describe various aspects of heat riser apparatus 100, as will be appreciated by one skilled in the art, fewer or additional formulas may be used in analyzing heat riser apparatus 100, and should not be limited solely to the formulas described above.

Figure 5:
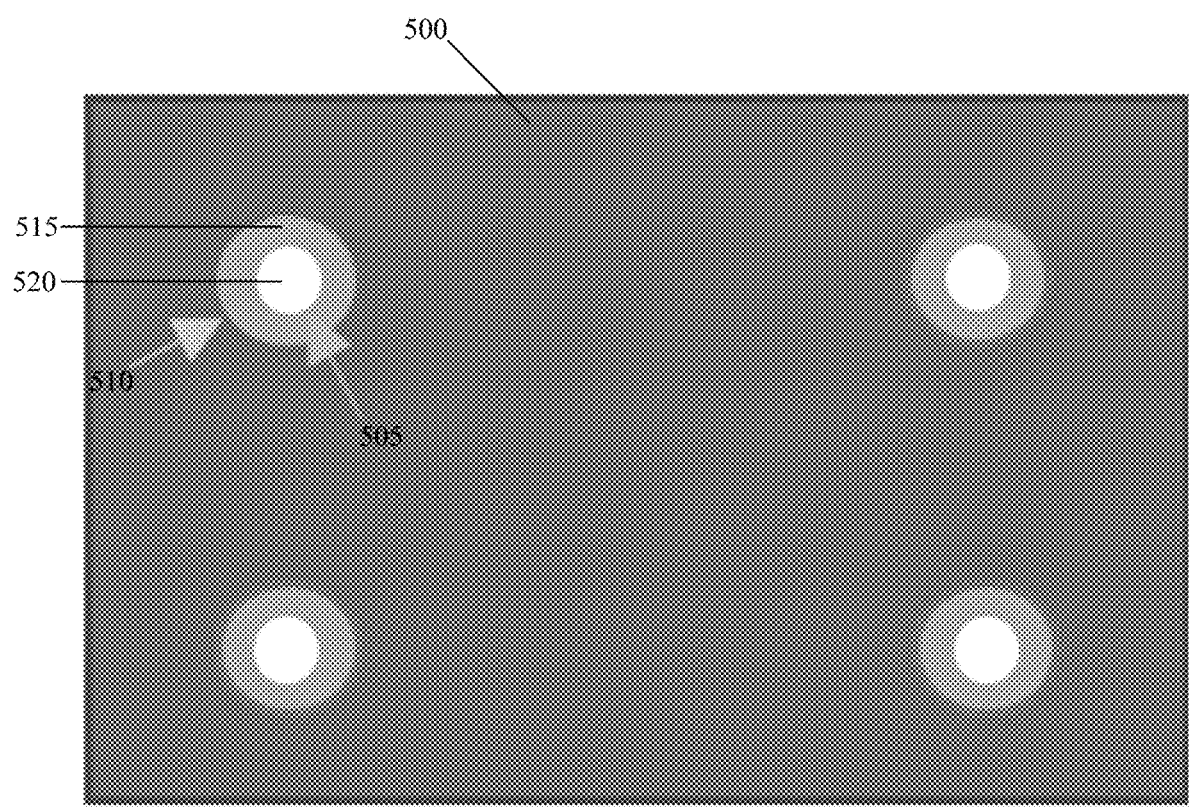
FIG. 5 illustrates an exemplary heat riser mounting, in accordance with an embodiment of the present invention.

FIG. 5 illustrates an exemplary heat riser mounting, in accordance with an embodiment of the present invention. Heat riser apparatus 100 may be adapted to fit many different mounting mechanisms, and thus may be able to be used in many different computing systems. In many cases, printed circuit board (PCB) 500 may include four mounting holes 520 with internal diameter 505 and external diameter 510. While many different mounting configurations may be possible, internal diameter 505 may be, for example, without limitation, 3 mm in diameter, and external diameter 510 may be, for example, without limitation 5 mm in diameter, creating concentric rings 515 which may be the contact area between PCB 500 and heat riser apparatus 100. As will be appreciated by one skilled in the art, many different mounting mechanisms may be used in combination with heat riser apparatus 100, and heat riser apparatus 100 may not be limited to being mounted in the configuration described above. The specific interface may vary depending on a variety of different factors, such as, without limitation, CPU brand, clearance factors, etc. For different mounting configurations, it may be important to adjust the elastic components to accommodate for a variety of different systems and ensure tight contact and proper stress on PCB 500.

Figure 6A:
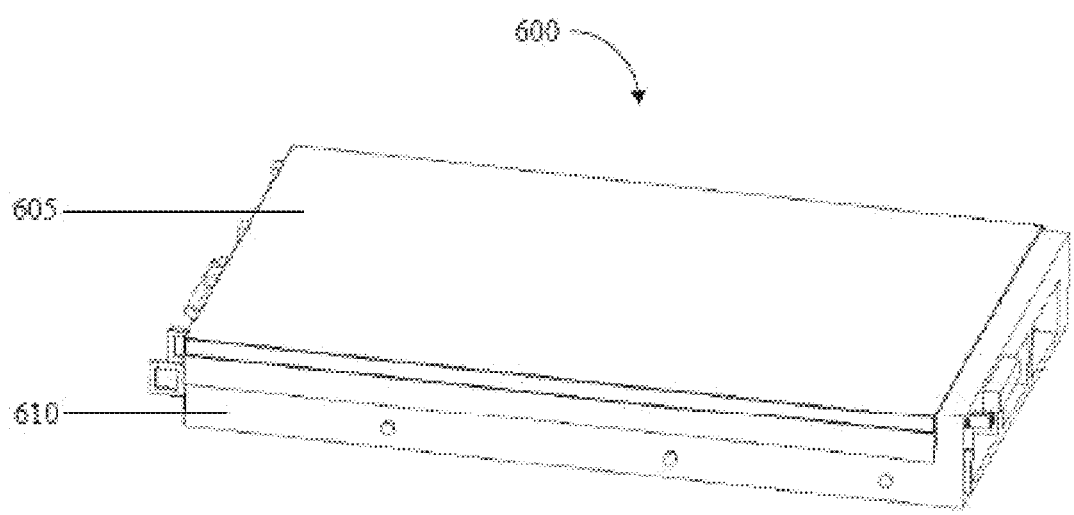
Figure 6B:
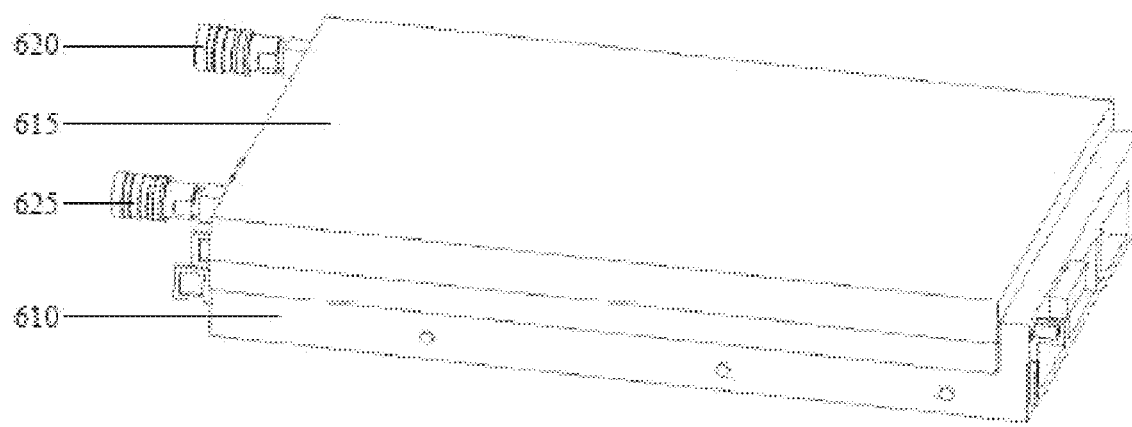
Figure 6C:
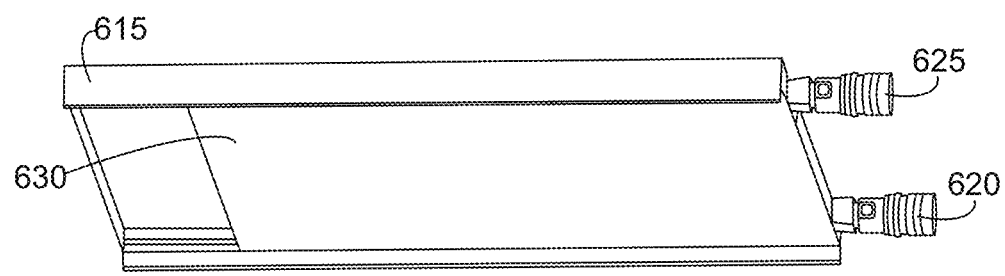

FIGS. 6A-6C illustrate an exemplary modified server cover, wherein FIG. 6A shows a conventional 2U server, FIG. 6B shows a server with a mounted modified server cover, and FIG. 6C shows a bottom view of a modified server cover, in accordance with an embodiment of the present invention. While heat riser apparatus 100 may be integrated into many server environments without modification of the server, in some cases, it may be necessary to alter the lid of an existing server in order to accommodate for a liquid cooled cold plate for optimal heat dissipation. For example, without limitation, FIG. 6A shows server 600 without a cold plate, and may comprise removable server cover 605 and server chassis 610. Server 600 may be a conventional 2U server, and may subsequently incorporate heat riser apparatus 100. As it would be desirable for the upper surface of heat riser apparatus 100 to be in contact with a cold plate, removable server cover 605 may be replaced with a separate embodiment with an incorporated cold plate, as shown in FIGS. 6B-6C. Replacement cover 615 may be used to incorporate cold plate 630 into server 600. Replacement cover 615 may include inlet 620 and outlet 625 for cycling liquid in and out of cold plate 630. Inlet 620 and outlet 625 may be dripless, quick-connect connectors for ease of set up and the prevention of spills. Replacement cover 615 may have the same locking mechanism as server cover 605 to allow for a seamless integration with server chassis 610. Cold plate 630 may be included on the underside of replacement cover 615 and may come into direct contact with the upper surface of heat riser apparatus 100 while also passively cooling the interior environment of server 600.

Figure 7A:
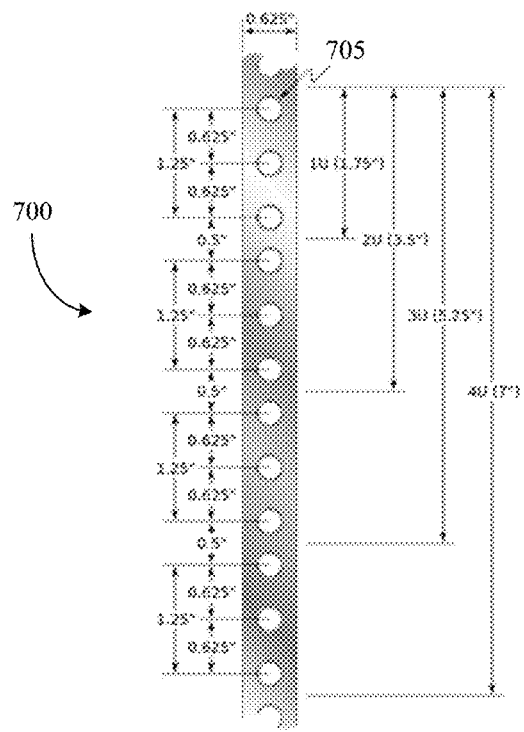
Figure 7B:
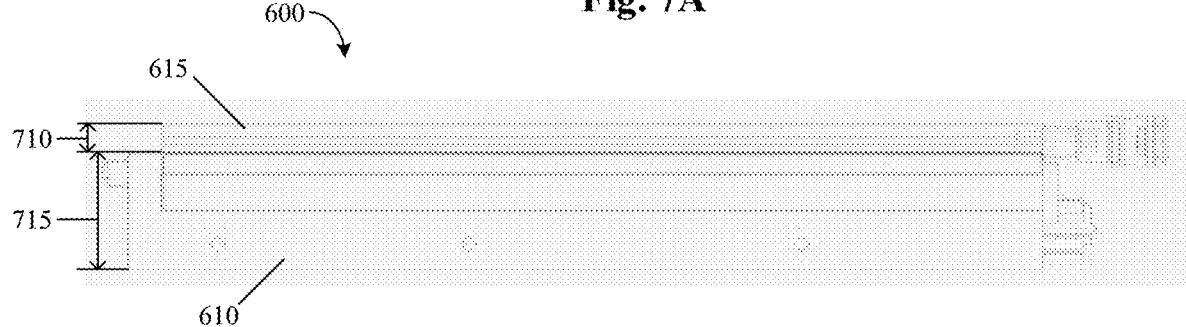

FIGS. 7A-7B illustrate exemplary server measurements, wherein FIG. 7A shows the height of an exemplary server, and FIG. 7B shows a side view of an exemplary server, in accordance with an embodiment of the present invention. With reference to both FIGS. 6A-6C and FIGS. 7A-7B, conventional server implementations typically use a rack system for organization, and may use a standardization for height between 1U and 4U. A conventional server system may use rack 700 to mount different servers, and rack 700 may include mounting holes 705 to be used with servers with heights between 1U and 4U. With replacement cover 615 mounted on server chassis 610, extra height may be added to server 600. With replacement cover height 710 being 0.5U and server chassis height 715 being 2.0U, the height of server 600 may become 2.5U with replacement cover 615, which may still be mountable on server rack 700. Additionally, replacement cover 700 may be integrated with other pre-existing server heights. For example, without limitation, a 1U server may include a 0.5U height replacement cover, and a 3U server may include a 1U height replacement cover, etc.

Figure 8A:
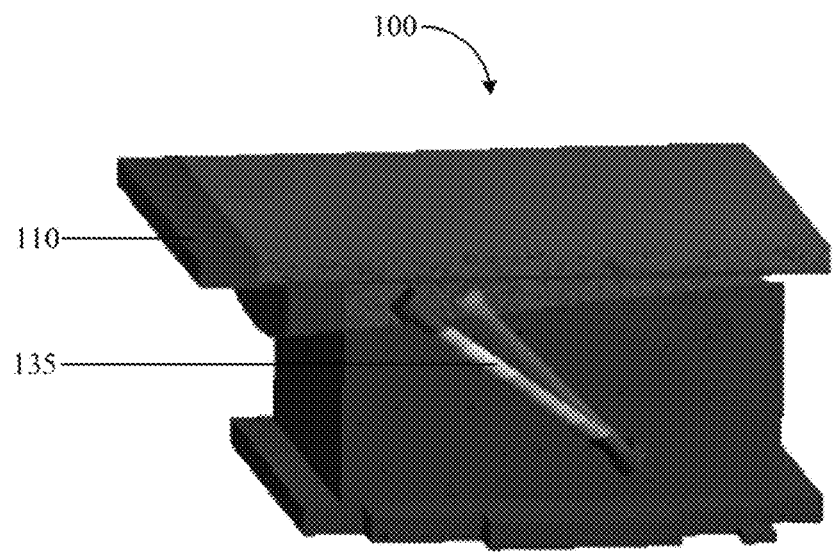
Figure 8B:
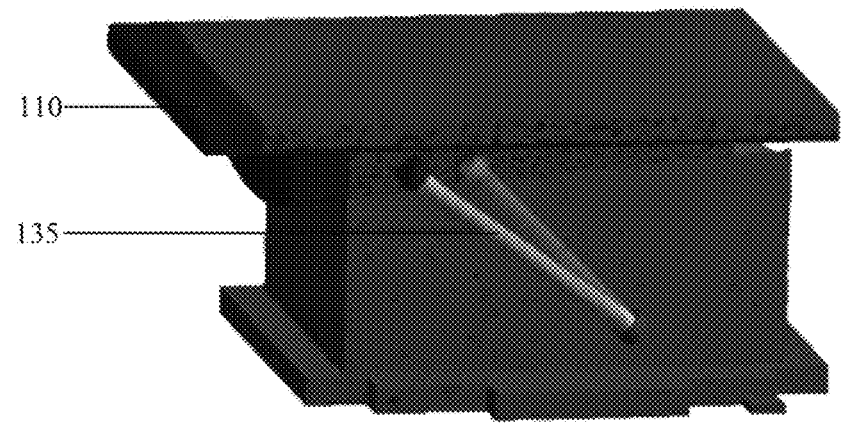
Figure 8C:
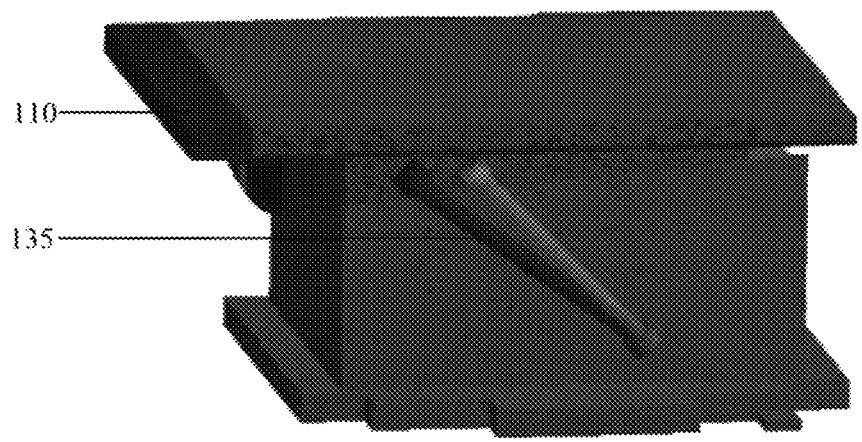

FIGS. 8A-8C illustrates a stress diagram of an exemplary heat riser apparatus, wherein FIG. 8A shows a heat riser apparatus with total deformation, FIG. 8B shows a heat riser apparatus with strain distribution on all components, and FIG. 8C shows a heat riser apparatus with an even distribution of stress on elastic components, in accordance with an embodiment of the present invention. With reference to FIGS. 1A-1C and FIGS. 8A-8C, stress analysis together with the calculation based on the equations in FIG. 4 may be used to determine, for example, without limitation, mounting placement of elastic components 135, elasticity of elastic components 135, height of heat riser 100, radial and axial displacement of upper block 110, etc. As shown in FIG. 8A, total deformation of heat riser apparatus 100 is shown, with variable stress on elastic components 135 while upper block 110 is pushed into a downward position. Such a configuration of heat riser apparatus 100 is not desirable, and further tweaking of the configuration of heat riser apparatus 100 must be done for optimal heat dissipation results and longevity of the cooling system. As shown in FIG. 8B, there is a stress distribution on elastic components 135 and throughout heat riser apparatus 100, and low stress concentration on the system in general. In such a configuration, longevity of heat riser apparatus 100 may be achieved. As shown in FIG. 8C, while there is an even amount of stress throughout heat riser apparatus 100, an additional amount of stress is placed on elastic components 135. Such a configuration, while not ideal, may be an adequate solution for some server configurations. The aforementioned three examples shown in FIGS. 8A-8C illustrate the importance of strain and stress simulation on heat riser apparatus 100, as heat riser apparatus 100 may be adapted to being used in a variety of different server configurations. Simulation software may be used in combination with the multi-dimensional tolerance compensation of heat riser apparatus 100 may allow heat riser apparatus 100 to take on an optimal configuration depending on the server environment.

Figure 9A:
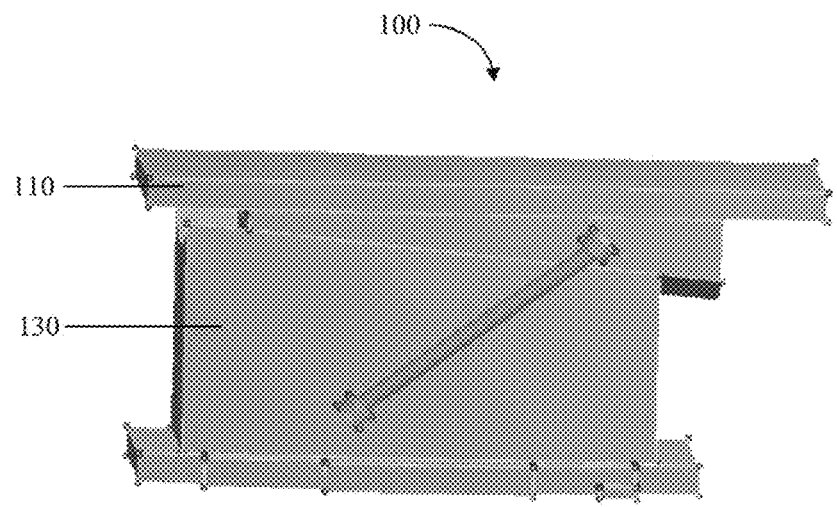
Figure 9B:
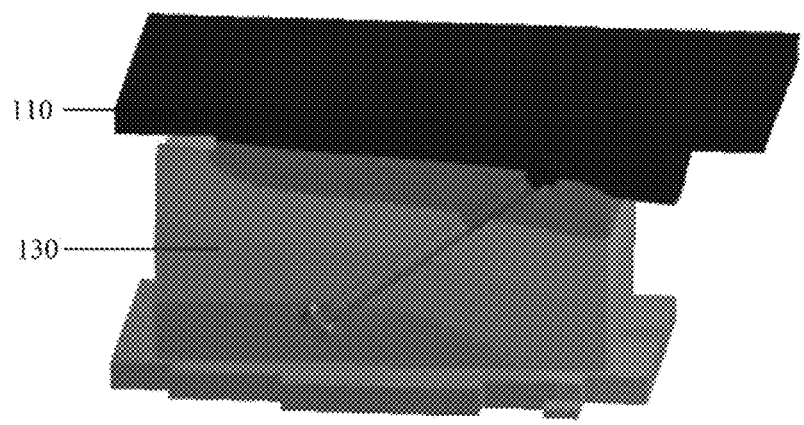
Figure 9C:
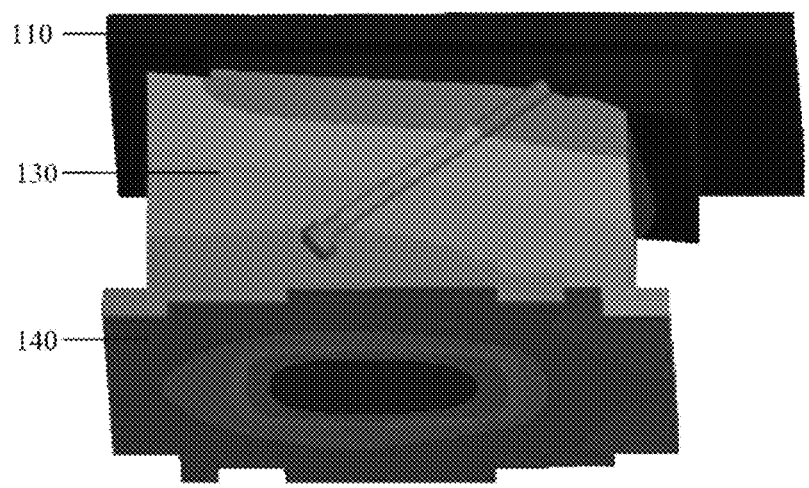

FIGS. 9A-9C illustrates thermal simulation of an exemplary heat riser apparatus, wherein FIG. 9A shows a physical model of a heat riser apparatus, FIG. 9B shows a temperature gradient and thermal pathway of a heat riser apparatus, and FIG. 9C shows a bottom view of a temperature gradient of a heat riser apparatus, in accordance with an embodiment of the present invention. With reference to FIGS. 1A-1C and FIGS. 9A-9C, before, after, or during stress or strain simulation of heat riser apparatus 100, thermal performance simulation may also be performed. Thermal performance of heat riser apparatus 100 may focus on a temperature differential under certain heat flux density conditions of various heat sources. Thermal performance simulation may also be used to compare and contrast the performance of heat riser apparatus 100 with more conventional approaches, such as, without limitation, air-cooled heat sinks. In the following simulations, heat riser apparatus 100 may be assumed to be in contact with a constant 35° C. and attached to heat sources with 500 W flow flux. As will be appreciated by one skilled in the art, various different simulation variables may be used depending on the needs of the specific system to which heat riser apparatus 100 will be installed. As shown in the results of thermal performance simulation in FIGS. 9B-9C, the temperature gradient of lower block 130 is higher than that of upper block 110, which may require further optimization of heat riser apparatus 100 to ensure ideal heat dissipation capabilities of the thermally coupled blocks. Further, the temperature in the center of bottom surface 140 of lower block 130 is shown to be 53° C., which may be within preferred ranges for a CPU.

Figure 10A:
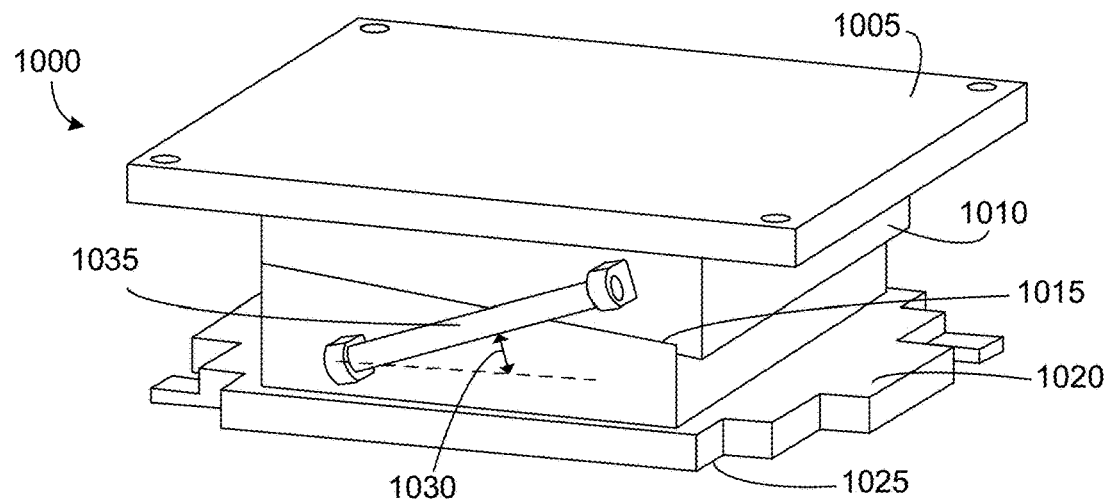
Figure 10B:
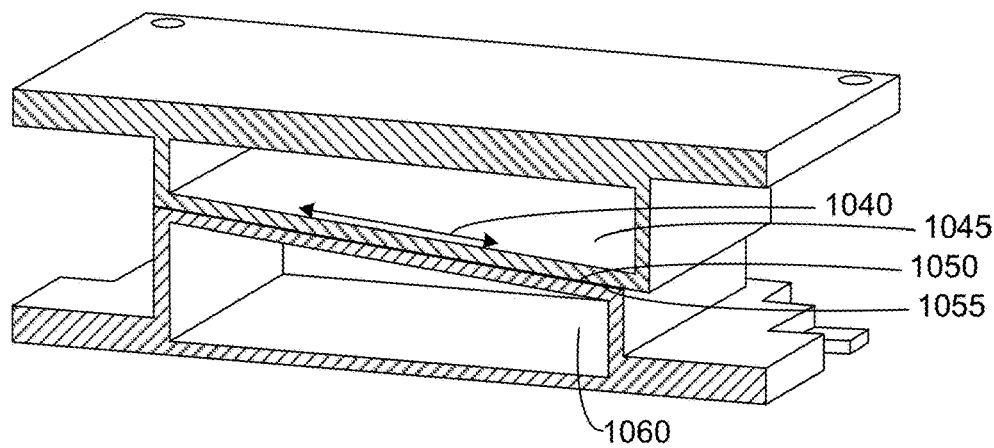
Figure 10C:
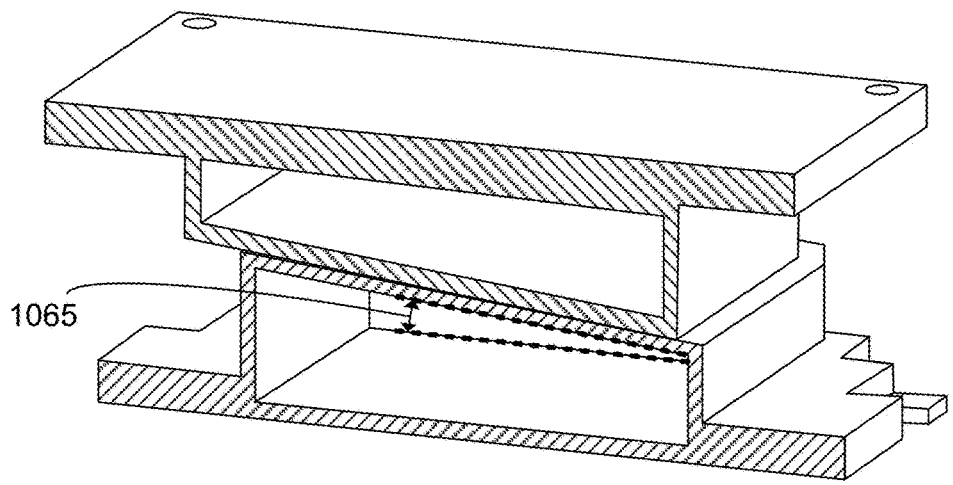

FIGS. 10A-10C illustrate an exemplary simplified heat riser, wherein FIG. 10A shows a prospective view of a simplified heat riser, FIG. 10B shows a cross section of a simplified heat riser, and FIG. 10C shows a cross section of a simplified heat riser at sliding-up conditions, in accordance with an embodiment of the present invention. Simplified heat riser 1000 may be the simplest embodiment of the present invention, wherein the surface between upper block 1010 and lower block 1020 may comprise a flat plane. Because simplified heat riser 1000 is less sophisticated than the embodiment described above with reference to FIGS. 1A-1C, simplified heat riser 100 may be easier to be machined. However, other difficulties may arise in machining other components of a server such as, without limitation, heat sources, cold plates, a locking mechanism of a server lid, etc. as this planar contacting may only absorb the clearance in the Z (i.e. upwards) direction. As such, the universal server chassis, cold plate, and heat sources may need to be redesigned for tight clearance control when incorporating simplified heat riser 1000. Simplified heat riser 1000 may be placed between a heat source and a cold plate in order to provide for heat dissipation of the heat source. Lower surface 1025 of simplified heat riser 1000 may contact a top surface of the heat source to ensure that heat generated by the heat source may be conducted to simplified heat riser 1000. Similarly, top surface 1005 of simplified heat riser 1000 may be pressed to contact with a lower surface of a cold plate to let heat flow from simplified heat riser 1000 to the cold plate. Therefore, the main function of simplified heat riser 1000 may be to transfer heat from a heat source to a cold plate.

Simplified heat riser 1000 may comprise upper block 1010 and lower block 1020. Lower block 1020 may have two major surfaces: lower surface 1025 and upper inclined plane 1055. Likewise, upper block 1010 may have two major surfaces: upper surface 1005 and lower inclined plane 1050. Lower block 1020 may be opposite to upper block 1010, and upper inclined plane 1055 of lower block 1020 may make contact with lower inclined plane 1050 of upper block 1010. Lower block 1020 may be mounted to a motherboard and make direct contact with a heat source in need of heat dissipation. Upper block 1010 may slide via translation along axial direction 1040 of the coupled inclined plane comprising upper inclined plane 1055 and lower inclined plane 1050 by angle 1065 between a default configuration as shown in FIG. 10B and a sliding-up configuration as shown in FIG. 10C. While upper block 1010 translates along axial direction 1040, upper surface 1005 of simplified heat riser 1000 may be either lifted or lowered so that upper surface 1005 may make solid contact with the lower surface of the cold plate. In order to hold upper block 1010 in a position in which it abuts against lower block 1020 as well as the lower surface of the cold plate, a predetermined amount of force may be applied to upper block 1010, said force determining the force of pressure that, taking friction into consideration, is exerted by upper block 1010 on lower block 1020 and the cold plate. Preferably, the force may be selected such that the force is great enough to ensure a secure abutment of upper block 1010 against lower block 1020 and the cold plate, said abutment unimpaired by gravity or accelerating forces due to vibration. At the same time, the force may be limited so that lower block 1020 and heat sources, such as, without limitation, a chip on a motherboard, do not incur any damage. The force may be applied using elastic components 1035, in which distal ends of each elastic component 1035 may be screwed to upper block 1010 and lower block 1020. Elastic components 1035 may be mounted symmetrically at an angle against horizon 1030, as shown in FIG. 10A. The static force decomposition of elastic force from elastic components 1035 may indicate that if the elastic force of elastic components, including, for example, without limitation, magnitude and direction, may be selected, an optimal and stable press force on the contacting surfaces of simplified heat riser 1000 for minimal thermal contact resistance may be achieved without sacrificing reliability.

Edges 1015 located at both sides of lower block 1020 may symmetrically work together with upper inclined plane 1055 as a guiding mechanism of upper block 1010. Alternatively, edges 1015 may be located at either side of upper block 1010 to symmetrically work together with lower inclined plane 1050 as a guiding mechanism of upper block 1010.

One or more of lower block 1020 and upper block 1010 may include vapor chambers such as, but not limited to, upper vapor chamber 1045 and lower vapor chamber 1060 to enhance the heat dissipation capabilities of simplified heat riser 1000 up to 500 W per CPU under the limits of internal server volume. As will be appreciated by one skilled in the art, a plurality of multiple vapor chambers may be incorporated into either or both of upper block 1010 and lower block 1020, and may not be limited to only upper vapor chamber 1045 and lower vapor chamber 1060. Additionally, the gap between the lower surface of the cold plate against top surface 1005 and the gap between the upper surface of the heat source and lower surface 1025 may be filled with thermal grease to minimize thermal resistance. Because the cold plate may be on top of the server other minor heat sources such as, without limitation, the GPU, memory, drivers, etc. may be cooled through natural convection.

Figure 11A:
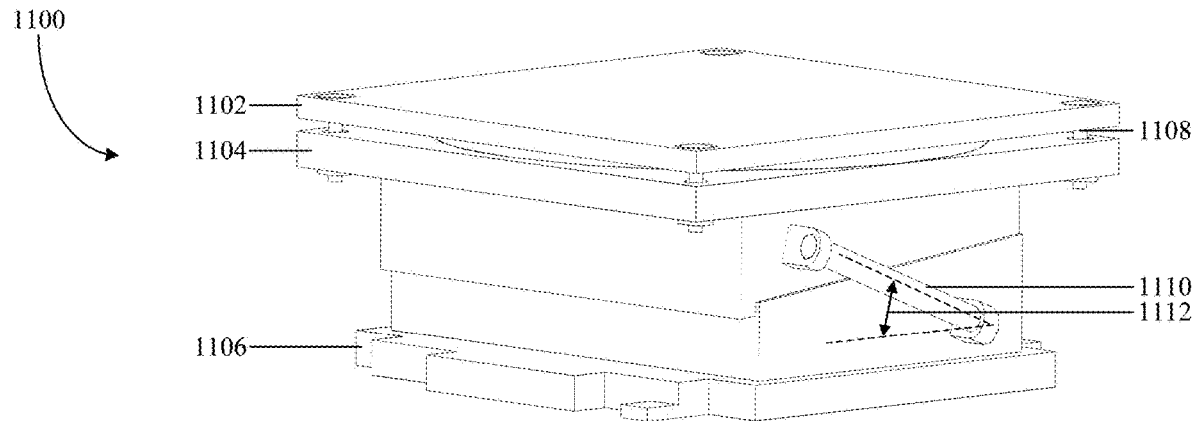
Figure 11B:
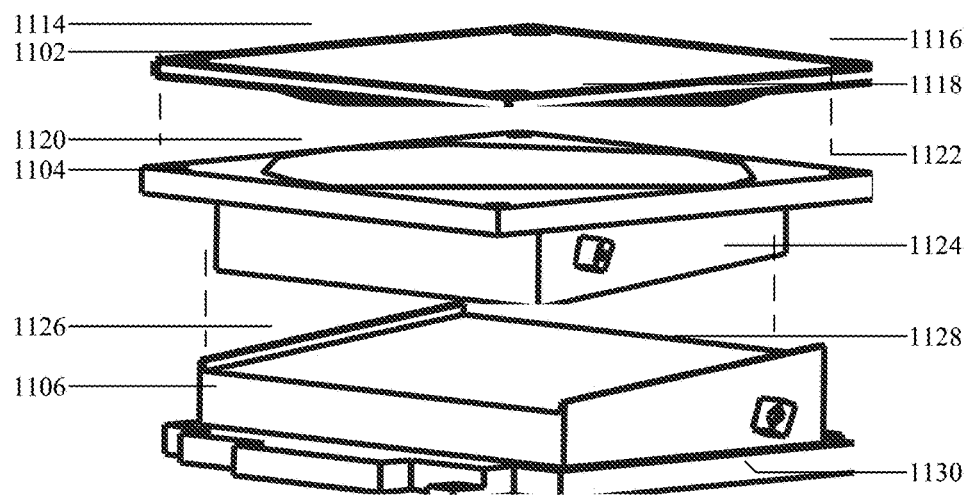
Figure 11C:
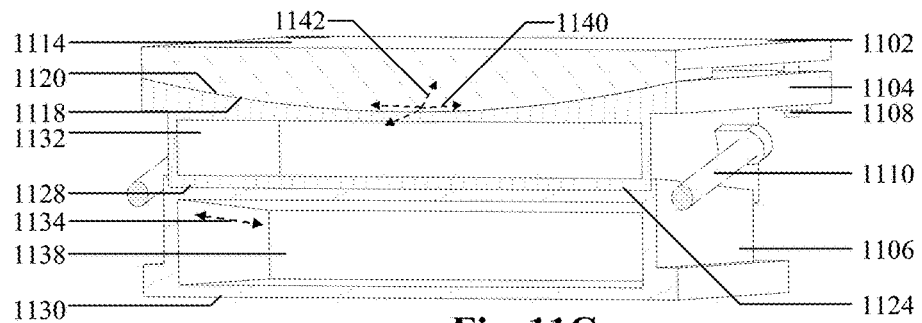

FIGS. 11A-11C illustrate an exemplary triple block heat riser, wherein FIG. 11A shows a prospective view of a triple block heat riser, FIG. 11B shows an exploded view of a triple block heat riser, and FIG. 11C shows a cross-sectional view of a triple block heat riser, in accordance with an embodiment of the present invention. Triple block het riser 1100 may comprise upper block 1102, middle block 1104, and lower block 1106, wherein the contacting surface between upper block 1102 and middle block 1104 may be a spherical surface, with one surface having a generally concave depression form and one having a generally convex protrusion form, and the contacting surface between middle block 1104 and lower block 1106 may be a flat plane. As such, triple block heat riser 1100 may compensate for clearance in three directions, at the cost of cost efficiency in machining the two spherical surfaces of upper block 1102 and middle block 1104. Triple block heat riser 1100 may be placed between a cold plate and a heat source to transfer heat from the heat source to the cold plate. Lower surface 1130 of triple block heat riser 1100 may make direct contact with the top surface of the heat source to ensure that heat generated by the heat source may be conducted to triple block heat riser 1100. Similarly, top surface 1114 of triple block heat riser 1100 may be pressed to contact with the lower surface of the cold plate to allow heat to flow from triple block heat riser 1100 to the cold plate. Lower block 1106 may have two major surfaces: lower surface 1130 and upper inclined plane 1128. Middle block may have two major surfaces: lower inclined plane 1124 and upper spherical surface 1120. Similarly, upper block may have two major surfaces: lower spherical surface 1118 and upper surface 1114. Lower block 1106 may be opposite to and make contact with middle block 1104 at upper inclined plane 1128 of lower block 1106 and lower inclined plane 1124 of middle block 1104. Lower block 1106 may be mounted on a motherboard and make direct contact with the heat source for optimal heat dissipation. Middle block 1104 together with upper block 1102 may slide by translation along axial direction 1134 of the coupled incline plane comprising lower inclined plane 1124 and upper inclined plane 1128. When upper block 1102 together with middle block 1104 are translated along axial direction 1134, top surface 1114 of triple block heat riser 1100 may either be lifted or lowered, depending on the needs of the particular system. Meanwhile, upper block 1102 may also be rotated around via the sphere joint formed from upper spherical surface 1120 and lower spherical surface 1118. With the combination of lifting and lowering upper block 1102, top surface 1114 may compensate for a positional tolerance between the top surface 1114 and the lower surface of the cold plate in the X, Y, and Z directions.

In order to hold middle block 1104 in a position in which middle block 1104 abuts against lower block 1106 as well as against the cold plate, it is possible to apply a predetermined force to middle block 1104, said force determining the force of pressure that, taking into consideration, for example, without limitation, friction, may be exerted by middle block 1104 on lower block 1106 and the cold plate. Preferably, the force may be selected such that the force is great enough to ensure a secure abutment of middle block 1104 against lower block 1105 and the cold plate, such abutment unimpaired by gravity or accelerating forces due to vibration. Simultaneously, the force may be limited such that damage to lower block 1106 and the heat source, such as, without limitation, a chip mounted to a motherboard, may not be incurred. The force may be applied by elastic elements, which may be screwed to middle block 1104 and lower block 1106. Elastic components 1110 may be mounted symmetrically and adjusted at an angle against horizon 1112. The static force decomposition of elastic force from elastic components 1110, including, for example, without limitation, magnitude and direction, may be selected such that optimal and stable press force on the contacting surfaces of triple block heat riser 1100 for minimal thermal contact resistance may be achieved without sacrificing reliability.

In order to hold upper block 1102 in a position in which it abuts against middle block 1104, a predetermined force may be applied to middle block 1104 and upper block 1102 by elastic components 1108, which may be installed vertically at upper block corners 1116 and middle block corners 1122. Preferably, the force may be selected such that the force is great enough to ensure a secure abutment of middle block 1104 against upper block 1102, said abutment unimpaired by gravity or accelerating forces due to vibration and achieve reasonable contact thermal resistance.

Edges 1126 may be located at either side of lower block 1106 of triple block heat riser 1100, and may symmetrically work together with upper inclined plane 1128 as a guiding mechanism for middle block 1104. Alternatively, edges 1126 may be located at either side of middle block 1104, and may symmetrically work together with lower inclined plane 1124 as a guiding mechanism for middle block 1104.

One or more of lower block 1106 and middle block 1104 may include vapor chambers, such as, without limitation, middle vapor chamber 1132 and lower vapor chamber 1138, which may enhance heat dissipation capabilities up to 500 W per CPU under the limits of internal server volume. Further, the gap between the lower surface of the cold plate and top surface 1114, the gap between lower spherical surface 1118 and upper spherical surface 1120, the gap between lower inclined plane 1124 and upper inclined plane 1128, and the gap between lower surface 1130 and the upper surface of the heat riser may be filled with thermal grease to minimize thermal resistance. Because the cold plate may be on top of the server, other minor heat sources, such as, without limitation, a GPU, memory, drivers, etc. may be cooled by the cold plate through natural convection.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing a heat riser apparatus according to the present invention will be apparent to those skilled in the art. Various aspects of the invention have been described above by way of illustration, and the specific embodiments disclosed are not intended to limit the invention to the particular forms disclosed. The particular implementation of the heat riser apparatus may vary depending upon the particular context or application. By way of example, and not limitation, the heat riser apparatus described in the foregoing were principally directed to computer component cooling implementations; however, similar techniques may instead be applied to cooling telecommunication equipment, IGBT power electronic devices and modules, high-power semiconductor diode lasers, etc., which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre AIA) or 35 USC 112(f) post-AIA. Otherwise, no limitations from the specification are to be read into any claims, unless those limitations are expressly included in the claims.

What is claimed is:

1. A heat riser apparatus, comprising:
   at least two stackable blocks, in which at least a portion of each is comprised of a thermally conductive material;
   said at least two stackable blocks include at least an upper block and a lower block;
   said lower block having a lower surface configured to be engaged in thermal communication to a heat source;
   said lower block having an inclined upper surface;
   said inclined upper surface of said lower block is configured to be in thermal communication with said upper block above said lower block;
   said lower block and said upper block above said lower block are elastically coupled with elastic components on opposing sides of said lower block and said upper block above said lower block;
   said upper block above said lower block has a complemental incline in which said upper block above said lower block may slide along said lower block thereby allowing for vertical and horizontal axial elastic adjustment while providing consistent pressure to both said heat source and a cooling source to provide for heat dispersion along a thermal pathway; and
   said upper block having an upper surface and a lower surface, wherein said upper surface is configured to be in thermal communication with said cooling source, and in which said elastic components are engaged at an angle, wherein angulation assists with pressure requirements in order to provide an automatic tolerance compensation, wherein elastic limits are configured to be in a range of tensions that provide for secured couplement, but do not produce excess pressure that may damage any components therein.

2. The heat riser apparatus as recited in claim 1, in which said heating source is an electronic component.

3. The heat riser apparatus as recited in claim 1, in which said cooling source comprises a cold plate.

4. The heat riser apparatus as recited in claim 1, wherein at least one of said lower block and said upper block above said lower block further includes at least one internal vapor chamber.

5. The heat riser apparatus as recited in claim 4, wherein at least one internal vapor chamber is formed within a void hollowed out from each block, from said at least one of said lower block and said upper block above said lower block, containing a vapor chamber, wherein walls of said vapor chamber make up walls of each block.

6. The heat riser apparatus as recited in claim 4, wherein at least one internal vapor chamber is a pre-sealed vapor chamber tightly inserted in to a hollowed out cavity of each block, from said at least one of said lower block and said upper block above said lower block, containing a vapor chamber.

7. The heat riser apparatus as recited in claim 1, wherein the at least one of said lower block and said upper block above said lower block including at least one internal vapor chamber, further includes a plurality of internal vapor chambers per block.

8. The heat riser apparatus as recited in claim 1, in which said at least two stackable blocks consists of two blocks, wherein said upper block above said lower block is said upper block.

9. The heat riser apparatus as recited in claim 1, in which said at least two stackable blocks consists of three blocks, wherein said upper block above said lower block is a middle block.

10. The heat riser apparatus as recited in claim 9, wherein said middle block further includes a lower surface and an upper surface, wherein said lower surface is in thermal communication with said lower block and said upper surface includes a concave spherical depression for thermal communication with said upper block in which said upper block has a complemental convex spherical lower protrusion.

11. The heat riser apparatus as recited in claim 1, in which the upper surface of said lower block is a concave cylinder indention with an axial orientation parallel to the incline of said upper surface of said lower block, and said bottom surface of said upper block above said lower block includes a complemental convex cylindrical protrusion with an axial orientation parallel to the incline of said lower surface of said upper block above said lower block.

12. The heat riser apparatus as recited in claim 1, in which said elastic components are secured at distal ends of each elastic component by a screw at each distal end, wherein a screw at an lower distal end secures said elastic component to said lower block, and a screw at an upper distal end secures said elastic component to said upper block above said lower block.

13. The heat riser apparatus as recited in claim 1, further comprising:
said cooling source comprises a cold plate;
said heating source is an electronic component, wherein said computer component includes at least one of a CPU, a GPU, and a power supply;
said at least two stackable blocks consists of two blocks, wherein said upper block above said lower block is said upper block;
said lower block includes an internal vapor chamber;
said upper block includes an internal vapor chamber;
said upper surface of said lower block is a concave cylinder indention with an axial orientation parallel to the incline of said upper surface of said lower block, and said bottom surface of said upper block includes a complemental convex cylindrical protrusion with an axial orientation parallel to the incline of said lower surface of said upper block above said lower block;
said elastic components are engaged at an angle, wherein angulation assists with pressure requirements in order to provide an automatic tolerance compensation, wherein elastic limits are configured to be in a range of tensions that provide for secured couplement, but do not produce excess pressure that may damage any of the components therein; and
said elastic components are secured at distal ends of each elastic component by a screw at each distal end, wherein a screw at an lower distal end secures said elastic component to said lower block, and a screw at an upper distal end secures said elastic component to said upper block.

14. A method, comprising:
providing a heat riser apparatus that is substantially as recited in claim 1 applying thermal grease to surfaces of the heat riser apparatus;
adjusting an angle of elastic components to achieve optimal mechanical and thermal performance; and
adjusting an angle of the inclined sliding surfaces to achieve optimal mechanical and thermal performance;
employing radial and spherical surfaces in between the lower block and said upper block above said lower block when multi-axial adjustment is needed.

15. The method as recited in claim 14, wherein providing said heat riser apparatus further comprises:
providing a sliding mechanism to achieve an automatic tolerance compensation approach, wherein said sliding mechanism comprises said incline of said lower block and said incline of said upper block above said lower block elastically engaging, wherein said lower block is statically engaged and said upper block above said lower block is dynamically slidable from use of elastic components that are engaged at an angle, wherein angulation assists with pressure requirements in order to provide an automatic tolerance compensation, wherein elastic limits are configured to be in a range of tensions that provide for secured couplement, but do not produce excess pressure that may damage any components therein;
configuring said elastic components to be secured at distal ends of each elastic component by a screw at each distal end, wherein a screw at an lower distal end secures said elastic component to said lower block, and a screw at an upper distal end secures said elastic component to said upper block above said lower block; and
slidably coupling said lower block to said upper block above said lower block allowing said lower block and said upper block above said lower block to slide for multi-axial adjustment.

16. The method as recited in claim 14, wherein providing said heat riser apparatus further comprises:
providing at least one of a spherical and radial surface between said lower block and said upper block above said lower block, wherein said at least one of a spherical and radial surface may be further defined as a concave depression in said upper surface of said lower block, and a convex protrusion on said lower surface of said upper block above said lower block, whereby said convex protrusion may slide axially along an incline of the upper surface of the lower block along the complemental concave depression.

17. The method as recited in claim 14, wherein providing said heat riser apparatus further comprises:
integrating at least one vapor chamber within said heat riser apparatus.

18. A system for a heat riser, comprising:
a heat riser apparatus, including at least two stackable blocks constructed of thermally conductive material, wherein said at least two stackable blocks include at least an upper block and a lower block;
said lower block having a lower surface configured to be engaged in thermal communication to a heat source;
thermal grease on surfaces of the heat riser apparatus;
said lower block having an inclined upper surface;
said inclined upper surface of said lower block is configured to be in thermal communication with said upper block above said lower block;
said lower block and said upper block above said lower block are elastically coupled with at least two elastic components on opposing sides of said lower block and said upper block above said lower block;
said upper block above said lower block has a complemental incline in which said upper block above said lower block may slide along said lower block thereby allowing for vertical and horizontal axial elastic adjustment while providing consistent pressure to both a said heat source and a cooling source to provide for adequate heat dispersion along a thermal pathway, and in which said elastic components are engaged at an angle, wherein angulation assists with pressure requirements in order to provide an automatic tolerance compensation, wherein elastic limits are configured to be in a range of tensions that provide for secured couplement, but do not produce excess pressure that may damage any components therein;

said upper block having an upper surface and a lower surface, wherein said upper surface is configured to be in thermal communication with said cooling source; and a cold plate provided as a cooling source, wherein said cold plate is engaged with a lid component of a server.

19. The system for a heat riser apparatus as recited in claim 18, further comprising:

said at least two stackable blocks consists of two blocks, wherein said upper block above said lower block is said upper block;

said lower block includes an internal vapor chamber;

said upper block includes an internal vapor chamber;

said upper surface of said lower block is a concave cylinder indention with an axial orientation parallel to the incline of said upper surface of said lower block, and said bottom surface of said upper block includes a complemental convex cylindrical protrusion with an axial orientation parallel to the incline of said lower surface of said upper block above said lower block;

said elastic components are engaged at an angle, wherein angulation assists with pressure requirements in order to provide an automatic tolerance compensation, wherein elastic limits are configured to be in a range of tensions that provide for secured couplement, but do not produce excess pressure that may damage any of the components therein; and said elastic components are secured at distal ends of each elastic component by a screw at each distal end, wherein a screw at an lower distal end secures said elastic component to said lower block, and a screw at an upper distal end secures said elastic component to said upper block.

* * * * *